(12) United States Patent
Chen et al.

(10) Patent No.: US 7,106,601 B2
(45) Date of Patent: Sep. 12, 2006

(54) MOUNTING APPARATUS FOR CIRCUIT BOARDS

(75) Inventors: Yun-Lung Chen, Tu-Cheng (TW); Jian Hu, Shenzhen (CN)

(73) Assignee: Hon Hai Precision Industry Co., Ltd., Tu-cheng (TW)

( * ) Notice: Subject to any disclaimer, the term of this patent is extended or adjusted under 35 U.S.C. 154(b) by 38 days.

(21) Appl. No.: 10/930,338

(22) Filed: Aug. 31, 2004

(65) Prior Publication Data

US 2005/0180121 A1    Aug. 18, 2005

(30) Foreign Application Priority Data

Feb. 17, 2004    (TW) .............................. 93202224 U

(51) Int. Cl.
*H05K 7/12* (2006.01)
*H05K 7/14* (2006.01)

(52) U.S. Cl. .................. 361/801; 361/759; 361/747; 361/732; 361/740; 361/807

(58) Field of Classification Search ................ 361/726, 361/732, 740, 747, 759, 801, 807–810; 174/138 D, 174/138 E, 138 G; 312/216
See application file for complete search history.

(56) References Cited

U.S. PATENT DOCUMENTS 5,490,038 A * 2/1996 Scholder et al. ............ 361/759
5,691,504 A * 11/1997 Sands et al. ............... 174/35 R
5,754,396 A   5/1998 Felcman et al. ............ 361/683
6,205,020 B1 * 3/2001 Felcman et al. ............ 361/683
6,362,978 B1 * 3/2002 Boe .......................... 361/825
6,385,051 B1 * 5/2002 Perez et al. ................. 361/759
6,771,516 B1 * 8/2004 Leman et al. ............... 361/825
6,934,162 B1 * 8/2005 Perez et al. ................. 361/759
6,937,476 B1 * 8/2005 Chen et al. ................. 361/756
6,982,878 B1 * 1/2006 Chen et al. ................. 361/801

* cited by examiner

*Primary Examiner*—Kamand Cuneo
*Assistant Examiner*—Dameon E. Levi
(74) *Attorney, Agent, or Firm*—Tim Tingkang Xia, Esq.; Morris, Manning & Martin

(57) ABSTRACT

A mounting apparatus for mounting a motherboard (70) having several first mounting holes (73) includes a chassis (10), a fixing member (30), and a supporting member (50). The chassis comprised a post (13) protruding from a bottom wall (11) thereof, and a number of standoffs (17) received in first the mounting hole. The fixing member is slidably mounted to the post, and includes a first engaging portion (35) protruding from a middle portion thereof. The supporting member is attached to the motherboard, and includes a second engaging portion (57) projecting from an end thereof. When the first engaging portion of the fixing member engages with the second engaging portion of the supporting member, the motherboard is in a lock state; when the first engaging portion of the fixing member disengages from the second engaging portion of the supporting member, the motherboard is in an unlock state.

21 Claims, 6 Drawing Sheets

MOUNTING APPARATUS FOR CIRCUIT BOARDS

BACKGROUND OF THE INVENTION

1. Field of the Invention

The present invention relates to mounting apparatuses for circuit boards, and particularly to a mounting apparatus that readily attach a circuit board onto a computer chassis.

2. Description of Related Art

For many years, the conventional method of installing a circuit board, such as a motherboard, in a computer was to simply screw the motherboard on a chassis of the computer. This motherboard installation method substantially increases the time and the cost because of the complexity and difficulty of assembled or disassembled.

A relatively recent improvement in the mounting of a motherboard in a computer is illustrated and described in U.S. Pat. No. 5,754,396. In this patent, the motherboard is mounted to a projection structure that can be slid into and out of a computer chassis to install and later remove the motherboard for access and service purpose.

While this projection structure hastens and reduces the cost associate with initially installing the motherboard in the chassis and subsequently removing the motherboard for service and replacement, it also increases the manufacturing cost of the computer since a configuration of the projection structure is complex.

A new mounting apparatus for circuit boards that overcomes the above-mentioned problems is desired.

SUMMARY OF THE INVENTION

An object of the present invention is to provide a mounting apparatus which can readily attach a circuit board onto a chassis.

In order to achieve the above object, a mounting apparatus in accordance with a preferred embodiment of the present invention comprises a chassis for mounting a motherboard, a fixing member, and a supporting member. The motherboard defines several first mounting holes. The chassis comprises a post arranged on a bottom wall thereof, and a plurality of standoffs received in the first mounting holes respectively. The fixing member is movably mounted to the post of the chassis. The fixing member comprises a first engaging portion protruding from a middle portion thereof. The supporting member is attached to the motherboard, and comprises a second engaging portion projecting from an end thereof. When the first engaging portion of the fixing member engages with the second engaging portion of the supporting member, the motherboard is in a lock state. When the first engaging portion of the fixing member disengages from the second engaging portion of the supporting member, the motherboard is in an unlock state.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
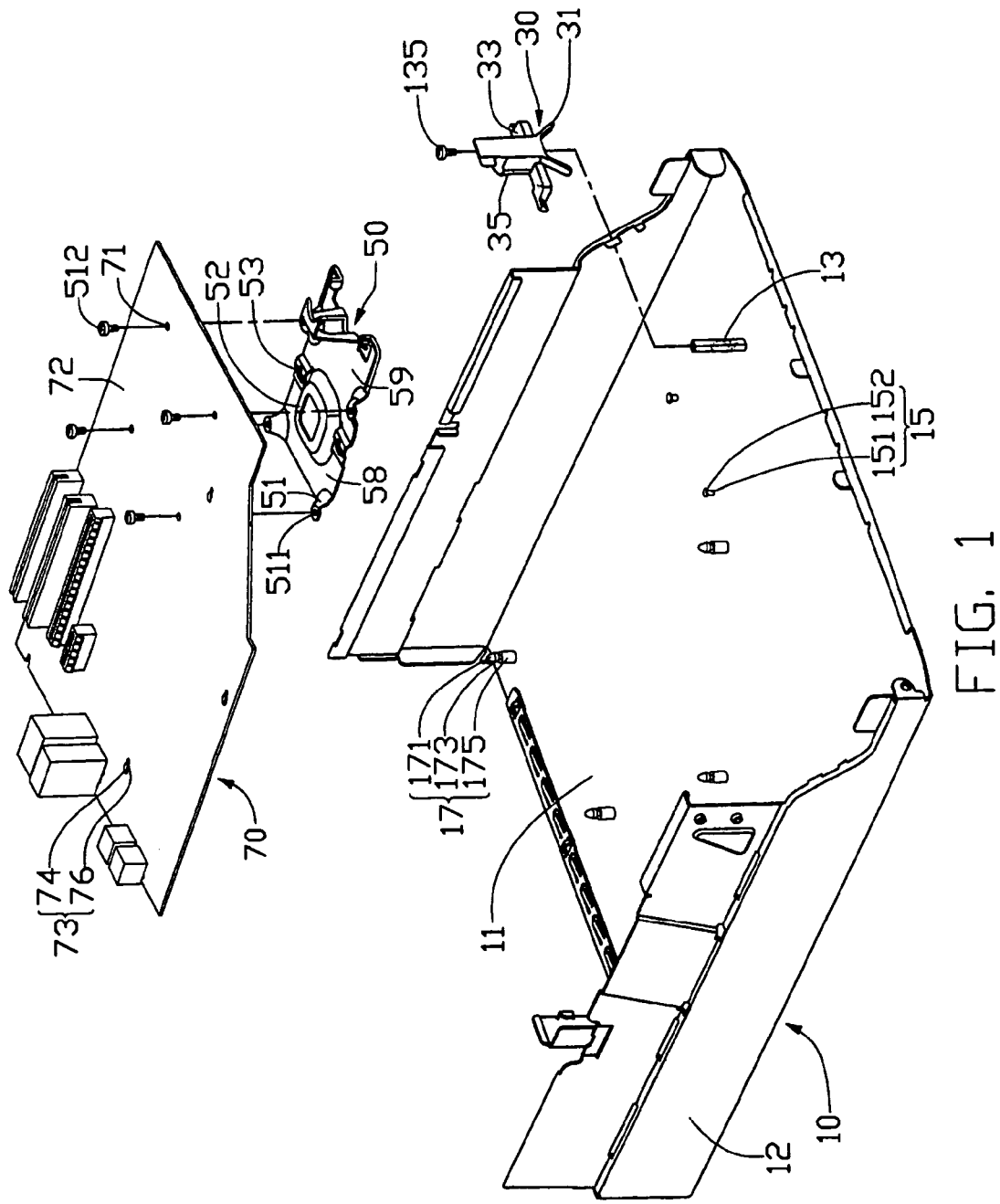
FIG. 1 is an exploded, isometric view of a mounting apparatus in accordance with a preferred embodiment of the present invention, together with a motherboard.

FIG. 1 shows a mounting apparatus in accordance with the preferred embodiment of the present invention, together with a circuit board such as a motherboard 70. The mounting apparatus comprises a chassis 10, a supporting member 50 and a fixing member 30.

The motherboard 70 is mounted to the chassis 10. The motherboard 70 has a generally planar, rectangular substrate body 72. The substrate body 72 defines several first mounting holes 73 therethrough, and several through holes 71 near an end thereof. Each first mounting hole 73 is generally calabash-shaped. The first mounting hole 73 has a first narrow portion 76, and a first broad portion 74.

Figure 2:
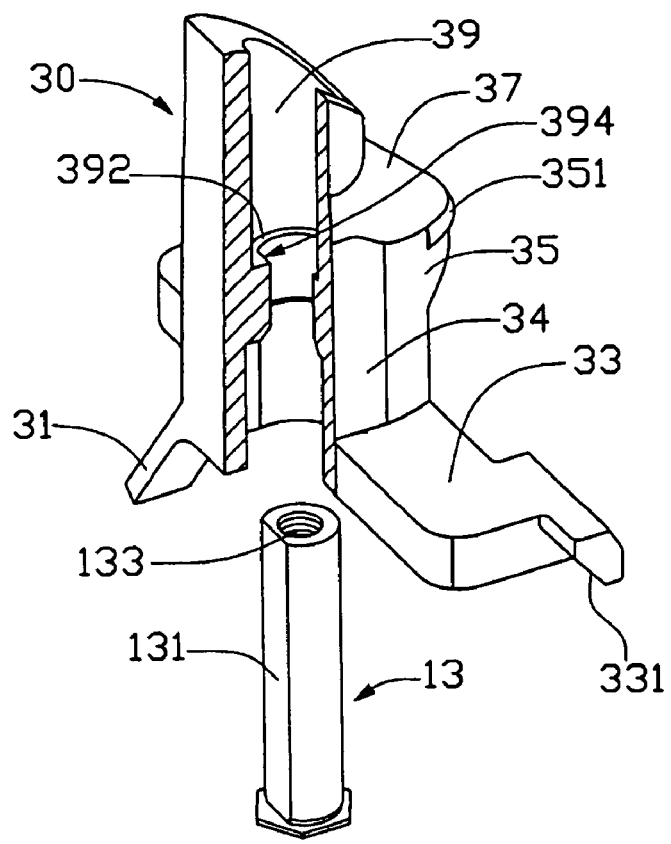
FIG. 2 is an enlarged, cut-away view of a fixing member of the mounting apparatus of FIG. 1, but viewed from another aspect, and an enlarged view of a post of a chassis of the mounting apparatus of FIG. 1.
Figure 3:
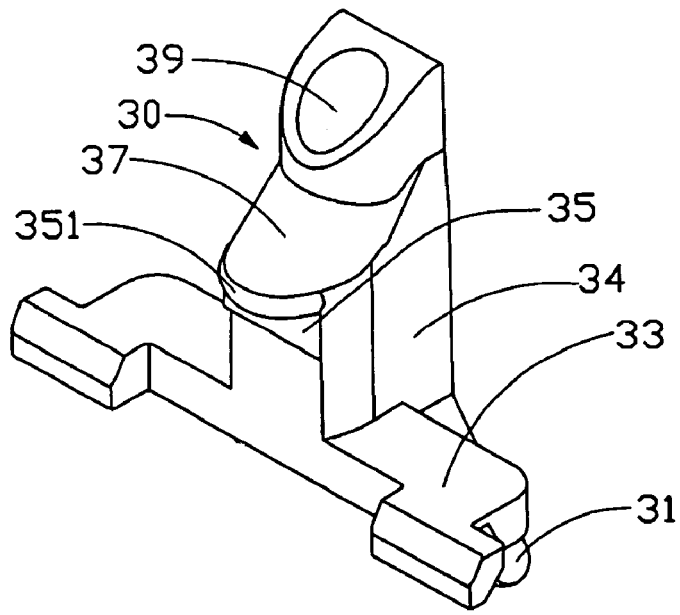
FIG. 3 is an enlarged view of the fixing member of the mounting apparatus of FIG. 1, but viewed from another aspect.
Figure 4:
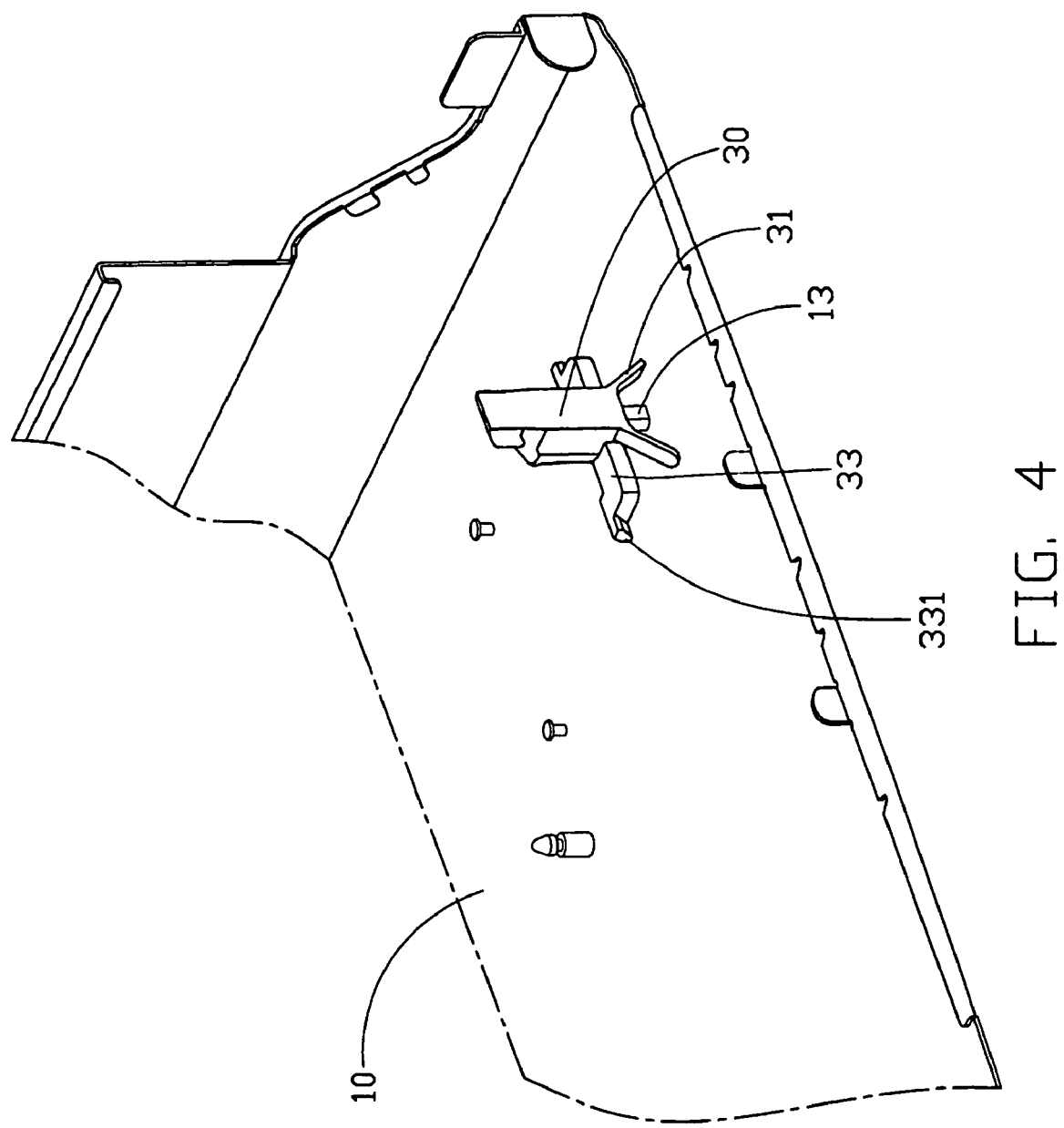
FIG. 4 is a partial, assembled view of the fixing member and the chassis of the mounting apparatus of FIG. 1.
Figure 5:
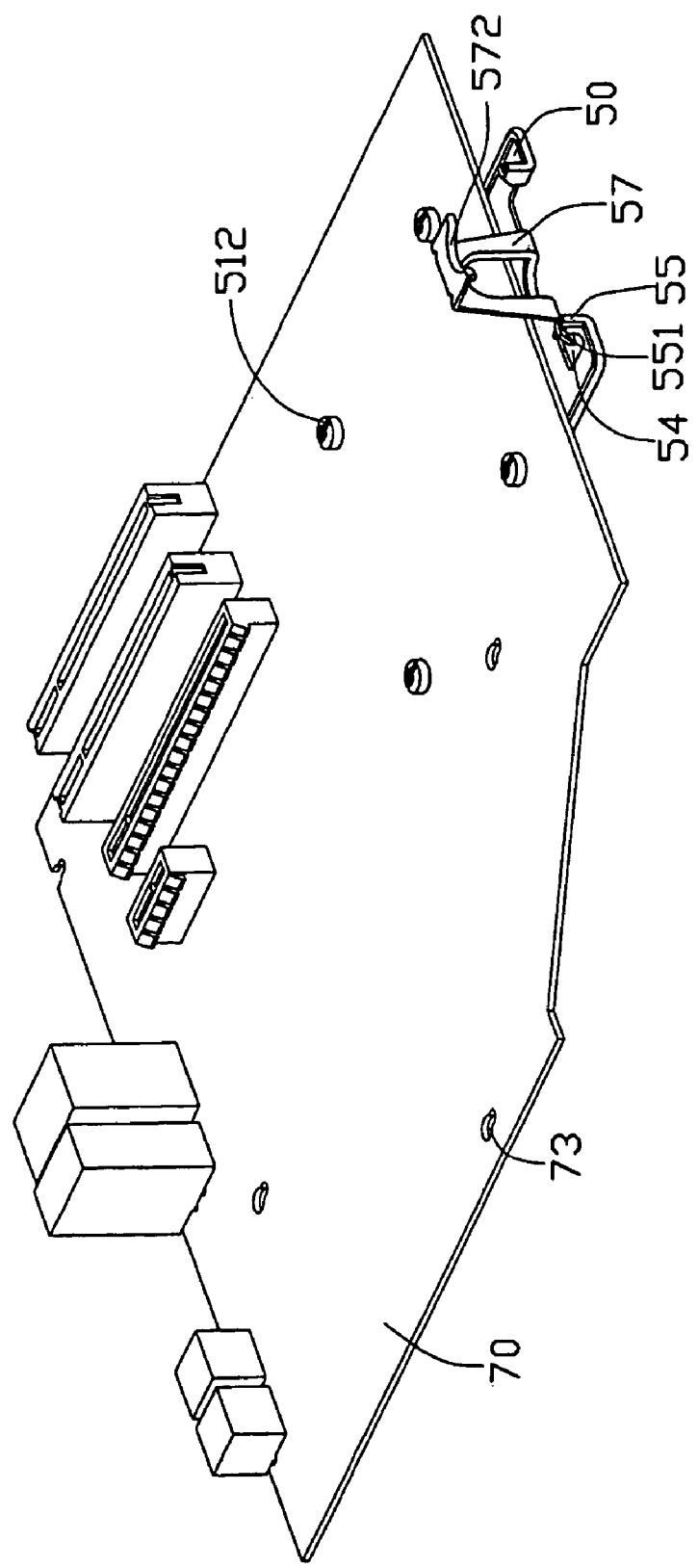
FIG. 5 is an enlarged, assembled view of a supporting member of the mounting apparatus and the motherboard of FIG. 1.
Figure 6:
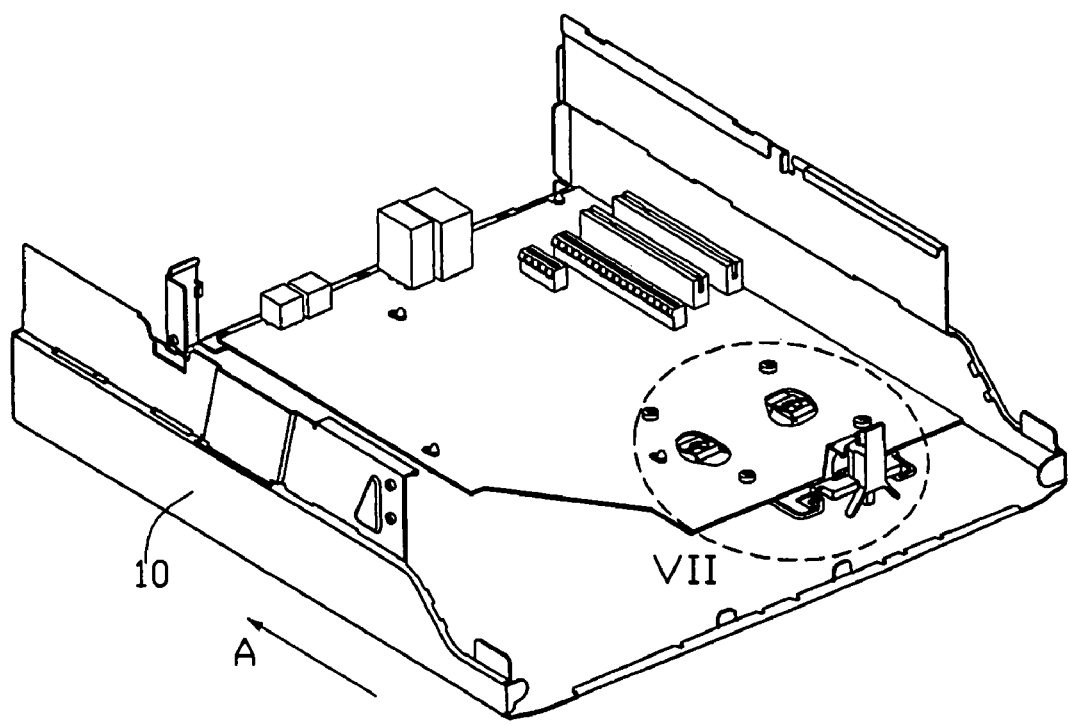
FIG. 6 is an assembled view of the mounting apparatus and the motherboard of FIG. 1, showing the motherboard in a lock state.
Figure 7:
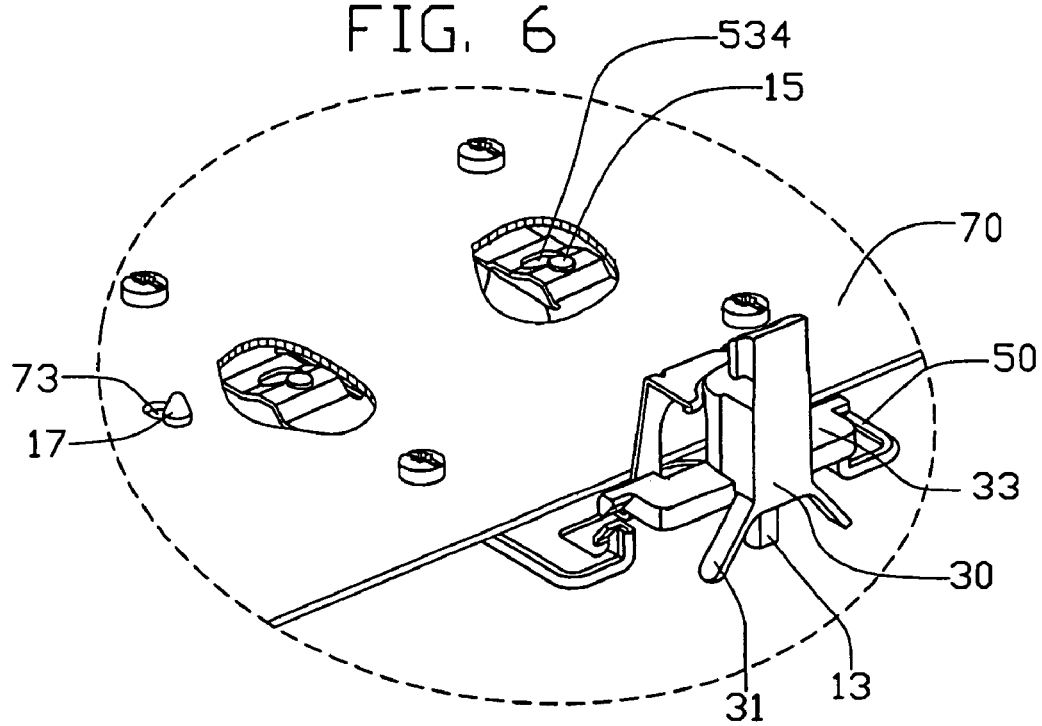
FIG. 7 is an enlarged view of a circle portion VII of FIG. 6.
Figure 8:
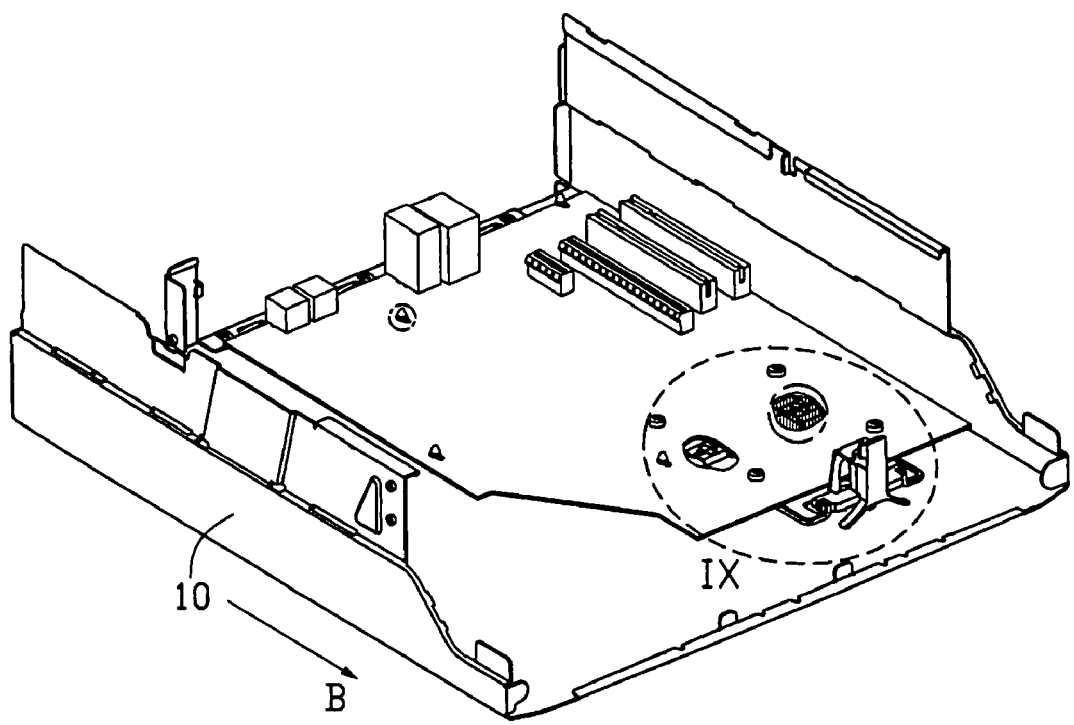
FIG. 8 is similar to FIG. 6, but showing the motherboard in an unlock state.
Figure 9:
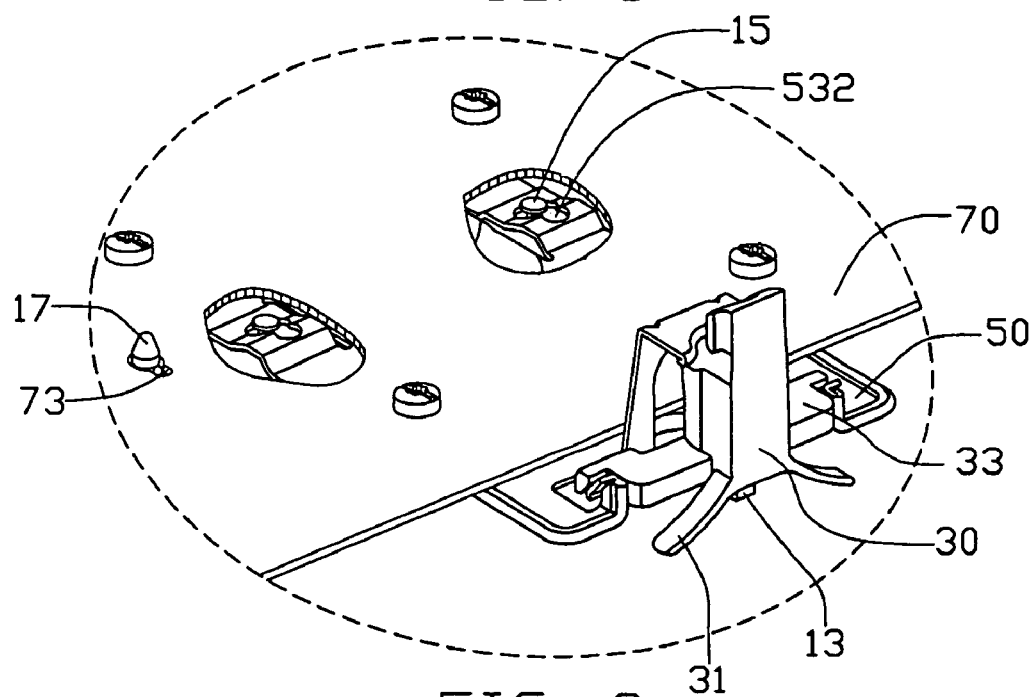
FIG. 9 is an enlarged view of a circle portion IX of FIG. 8.

The chassis 10 has a bottom wall 11. The bottom wall 11 has several upstanding standoffs 17 corresponding to the first mounting holes 73 of the motherboard 70, respectively. Each standoff 17 includes a cylindrical base portion 175, a generally conical upper end portion 171, and an intermediate neck portion 173 extending between the base portion 175 and the end portion 171. A diameter of the end portion 171 is smaller than that of the first broad portion 74 of the first mounting hole 73, and is greater than that of the first narrow portion 76 of the first mounting hole 73. A pair of screws 15 protrudes from the bottom wall 11 for retaining the supporting member 50. Each screw 15 has a cap portion 152, and a post portion 151. A post 13 projects from the bottom wall 11 for mounting the fixing member 30. Referring also to FIG. 2, the post 13 has a first planar portion 131 formed on an outer surface thereof, and a threaded hole 133 defined in a center of an upper portion thereof.

Referring to FIGS. 1–4, the fixing member 30 is mounted to the post 13 of the chassis 10. The fixing member 30 has a main body 34. A pair of resilient feet 31 extends from a bottom of the main body 34. A pair of symmetrical pressing arms 33 extends from left and right sides of a lower portion of the main body 34 respectively. Each pressing arm 33 has a first slope 331 formed at an inner side thereof. An inclined guiding portion 37 is formed on an upper portion of the main body 34. A first engaging portion 35 protrudes from a middle portion of the main body 34. The first engaging portion 35 is connected angularly with the guiding portion 37. A semi-circular bulge 351 protrudes outwardly from the first engaging portion 35. A through hole 39 is defined in a center of the main body 34, for receiving the post 13 of the chassis 10. An annular protrusion 392 projects from a middle of the hole 39. A diameter of an inner hole surrounded by the protrusion 392 is smaller than that of a screw cap (not labeled) of a screw 135. A second planar portion 394 is formed on an inner surface of the protrusion 392, corresponding to the first planar portion 131 of the post 13. The second planar portion 394 of the fixing member 30 and first planar portion of the post 13 cooperatively prevent the fixing member 30 from rotating around the post 13 of the chassis 10.

Referring to FIGS. 1, 5, 7 and 9, the supporting member 50 is partially mounted below the motherboard 10. The supporting member 50 has a main portion 58, and an extending portion 59 extending from an end of the main portion 58. Four protruding portions 51 project from four corners of the main portion 58, respectively. Each protruding portion 51 defines a threaded hole 511 corresponding to the hole 71 of the motherboard 70. An annular projection 52 protrudes from a center of the main portion 58 for supporting the motherboard 70. A pair of second mounting holes 53 is defined in the main portion 58 and located at opposite sides of the projection 52. Each second mounting hole 53 is also generally calabash-shaped. The second mounting hole 53 has a second narrow portion 532, and a second broad portion 534. A diameter of the narrow portion 532 is smaller than that of the cap portion 152 of the screw 15, and the diameter of the cap portion 152 of the screw 15 is smaller than that of the broad portion 534. A cutout 54 is defined in a distal end of the extending portion 59. A pair of bent portions 55 protrudes from right and left sides of the extending portion 59 surrounding the cutout 54, respectively. Each bent portion 55 has a second slope 551 engaging with the first slope 331 of the fixing member 30. A generally L-shaped second engaging portion 57 projects from a center of an end of the cutout 54. A curve recess 572 is defined at an end of a top portion of the second engaging portion 57 for receiving the bulge 351 of the fixing member 30.

Referring to FIGS. 1, 2, 6, 7 and 9, in assembly, the post 13 of the chassis 10 is received in the hole 39 of the fixing member 30. The first planar portion 131 of the post 13 abuts against the second planar portion 394 of the fixing member 30. The screw 135 is threadedly received in the threaded hole 133 of the post 13, so that the fixing member 30 is movably but unrotatably mounted to the bottom wall 11 of the chassis 10. The screws 512 are threadedly received in the corresponding threaded holes 511 of the supporting member 50 through the hole 71 of the motherboard 70, the motherboard 70 is thus engaged with the supporting member 50. The standoffs 17 of the chassis 10 are received in the corresponding first broad portions 74 of the first mounting holes 73 of the motherboard 70. The screws 15 are received in the second broad portion 534 of the second mounting hole 53 of the supporting member 50. The second engaging portion 57 of the supporting member 50 abuts against the guiding portion 37 of the fixing member 30 so as to form a first interaction mechanism. When the motherboard 70 is pressed, the second engaging portion 57 of the supporting member 50 slides downwardly along the guiding portion 37. The supporting member 50 exerts force on the fixing member 30 to cause the feet 31 to deform elastically. The fixing member 30 applies opposite force on the supporting member 50 to cause the motherboard 70 and the supporting member 50 to move along the direction of an arrow "A". When the recess 572 of the supporting member 50 abuts against the bulge 351 of the fixing member 30, the standoffs 17 are received in the corresponding first narrow portions 76 of the motherboard 70, and the screws 15 are received in the corresponding second narrow portions 532 of the supporting member 50 so as to form a third interaction mechanism. Simultaneously, each foot 31 of the fixing member 30 comes back its original position. Thus, the motherboard 70 together with the supporting member 50 is assembled to the chassis 10. In this position, the motherboard 70 is defined in a lock state.

Referring to FIGS. 1, 4–5, and 7–9, in removal of the motherboard 70 from the chassis 10, the fixing member 30 is pressed to cause each foot 31 of the fixing member 30 to deform elastically. The first slope 331 of the fixing member 30 exerts force on the second slope 551 of the supporting member 50 so as to form a second interaction mechanism. The recess 572 of the supporting member 50 moves upwardly along the guiding portion 37 of the fixing member 30. The motherboard 70 moves along the direction of an arrow "B". The standoffs 17 move to the first broad portions 74 of the motherboard 70, respectively. The screws 15 move to the second broad portions 534 of the supporting member 50, respectively. Thus, the motherboard 70 together with the supporting member 50 is disengaged from the chassis 10. In this position, the motherboard 70 is defined in an unlock state.

In the lock state, the fixing member 30 is engaged with the post 13 of the chassis 10, so that the motherboard cannot move along the direction of the arrow "B". Simultaneously, the diameter of the first narrow portion 76 of the first mounting hole 73 is smaller than that of the end portion 171 of the standoff 17. The diameter of the second narrow portion 532 of the second mounting hole 53 is smaller than that of the cap portion 151 of the screw 15. Therefore, the motherboard 70 together with the supporting member 50 is stably fixed in the lock state.

The feet 31 of the fixing member 30 can be replaced by other resilient members (not shown) attached to the post 13 of the chassis 10.

While a preferred embodiment in accordance with the present invention have been shown and described, equivalent modifications and changes known to persons skilled in the art according to the spirit of the present invention are considered within the scope of the present invention as defined in the appended claims.

What is claimed is:

1. A mounting apparatus for mounting a circuit board defining a plurality of first mounting holes, the mounting apparatus comprising:
   a chassis comprising a plurality of standoffs received in the first mounting holes respectively;
   a fixing member mounted to the chassis and movable along a post arranged on the chassis, the fixing member comprising a first engaging portion, at least one resilient member abutting against the chassis and a guiding portion; and
   a supporting member attached to the circuit board, the supporting member comprising a second engaging portion projecting from an end thereof; wherein
   when the circuit board is pressed, the second engaging portion of the supporting member slides downwardly along the guiding portion to cause said resilient member to deform, the first engaging portion of the fixing member engages with the second engaging portion of the supporting member, so that the circuit board is moved to a lock state;
   when the fixing member is pressed to cause the first engaging portion of the fixing member to disengage from the second engaging portion of the supporting member, the circuit board is moved to an unlock state.

2. The mounting apparatus as described in claim 1, wherein said resilient member comprises a pair of feet extending from a bottom of the fixing member, the guiding portion is formed at an upper portion of the fixing member, the first engaging portion is adjacent to the guiding portion.

3. The mounting apparatus as described in claim 1, wherein the fixing member defines a hole in a center thereof for receiving the post, the post forms a first planar surface, the hole forms a protrusion having a second planar surface corresponding to the first planar surface, so that the fixing member is not rotatable around the post.

4. The mounting apparatus as described in claim 3, wherein the post projects upwardly from the chassis and defines a threaded hole in an upper portion thereof, a screw is threadedly received in the threaded hole.

5. The mounting apparatus as described in claim 1, wherein a pair of pressing arms extends from opposite sides of a lower portion of the fixing member respectively, each of the pressing arms has a first slope.

6. The mounting apparatus as described in claim 5, wherein a pair of bent portions protrude from opposite sides of a cutout of the supporting member, each of the bent portions has a second slope engaging with the first slope of the fixing member.

7. The mounting apparatus as described in claim 1, wherein a bulge projects from the first engaging portion, a recess is defined in the second engaging portion, the recess engaging with the bulge.

8. The mounting apparatus as described in claim 1, wherein a pair of fasteners projects from the chassis, the supporting member defines a pair of second mounting holes engaging with the fasteners respectively.

9. A circuit board mounting apparatus assembly comprising:
 a circuit board defining a plurality of first mounting holes therethrough;
 a chassis for mounting the circuit board, the chassis comprising a post arranged on a bottom wall thereof, and a plurality of standoffs received in the first mounting holes respectively;
 a fixing member slidably mounted to the post, the fixing member comprising a first engaging portion formed at an upper portion thereof, and at least one first slope positioned in a lower portion thereof; and
 a supporting member attached to the circuit board, the supporting member comprising a second engaging portion projecting from an end thereof, and at least one second slope engaging with the first slope of the fixing member respectively;
 wherein when the first engaging portion of the fixing member engages with the second engaging portion of the supporting member, the circuit board is in a lock state;
 when the fixing member is pressed, said fist slope of the fixing member exert force on said second slope of the supporting member to cause the circuit board to move along a first direction and the first engaging portion of the fixing member to disengage from the second engaging portion of the supporting member, so that the circuit board is moved to an unlock state.

10. The mounting apparatus as described in claim 9, wherein the fixing member defines a hole in a center thereof for receiving the post, the post forms a first planar portion, the hole forms a protrusion having a second planar portion corresponding to the first planar surface, the first and second planar portions cooperatively prevent the fixing member from rotating around the post.

11. The mounting apparatus as described in claim 10, wherein the post protrudes upwardly from the bottom wall of the chassis and defines a threaded hole in an upper portion thereof, a screw is threadedly received in the threaded hole.

12. The mounting apparatus as described in claim 9, wherein a pair of resilient members extends from a bottom of the fixing member, a pair of symmetrical pressing arms extends from opposite sides of the fixing member respectively, a pair of first slopes is formed in the pressing arms respectively.

13. The mounting apparatus as described in claim 12, wherein a pair of bent portions protrudes from opposite sides of the supporting member, a pair of second slopes is located in the bent portions respectively, the second slopes engaging with the first slopes.

14. The mounting apparatus as described in claim 9, wherein a bulge projects from the first engaging portion, a recess is defined in the second engaging portion, the bulge is received in the recess.

15. The mounting apparatus as described in claim 9, wherein a pair of fasteners projects from the chassis, the supporting member defines a pair of second mounting hole in opposite sides thereof, the fasteners are received in the second mounting holes respectively.

16. A computer comprising:
 a chassis comprising a plurality of standoffs;
 a circuit board defining a plurality of mounting holes therein to slidably receive the standoffs;
 a fixing member mounted to the chassis and movable along a post which is vertical to the chassis, the fixing member comprising a first engaging portion formed at an upper portion thereof, a pressing arm formed at a lower portion thereof, and a resilient member abutting against the chassis;
 a support member fixed to the circuit board, the support member comprising a second engaging portion and a bent portion at an end thereof;
 wherein the circuit board is moved in a first direction so that the standoffs engage in ends of the mounting holes respectively, the first engaging portion abuts against the second engaging portion to prevent the circuit board from moving in a second direction opposite to the first direction; when the fixing member is moved along the post so that the first engaging portion releases the second engaging portion, the pressing arm presses the bent portion to drive the support member to move in the second direction.

17. The computer as recited in claim 16, wherein the post directly extends from the chassis, the fixing member defines a central hole therein to receive the post, and wherein the fixing member is movable along but unrotatable around the post.

18. The computer as recited in claim 16, wherein the resilient member comprises a pair of resilient feet which extends downwardly from a bottom portion of the fixing member.

19. The computer as recited in claim 16, wherein the pressing arm has a slanted surface, the bent portion has a corresponding slanted surface, and wherein when the fixing member is moved downwardly, the pressing arm moves the bent portion in the second direction.

20. A mounting apparatus for mounting a circuit board to a chassis of an electronic device, the mounting apparatus comprising:

a fixing member resiliently installed in said chassis beside a side of said circuit board, said fixing member comprising a first engaging portion and a pressing arm respectively formed thereof;

a support member fixed to the circuit board, the support member comprising a second engaging portion and a bent portion formed respectively thereof, said second engaging portion defining a first interaction mechanism incorporating with said first engaging portion of said fixing member, and said bent portion defining a second interaction mechanism incorporating with said pressing arm;

said circuit board received in said chassis and defining a reference plane, at least one third interaction mechanism defined between said circuit board and said chassis to confine movement of said circuit board away from said reference plane; and said first interaction mechanism operating to move said circuit board to a position where said at least one third interaction mechanism works, and said second interaction mechanism operating to move said circuit board away from said position of said circuit board.

21. The mounting apparatus as recited in claim 20, wherein said fixing member is resiliently movable between a position where said first interaction mechanism operates and the other position where said second interaction mechanism operates.

* * * * *